(12) United States Patent
Wu (10) Patent No.: US 11,251,810 B2
(45) Date of Patent: Feb. 15, 2022

(54) LOW-DENSITY PARITY-CHECK DECODING WITH DESATURATION

(71) Applicant: Beijing Tenafe Electronic Technology Co., Ltd., Beijing (CN)

(72) Inventor: Yingquan Wu, Palo Alto, CA (US)

(73) Assignee: Beijing Tenafe Electronic Technology Co., Ltd.

( * ) Notice: Subject to any disclaimer, the term of this patent is extended or adjusted under 35 U.S.C. 154(b) by 0 days.

(21) Appl. No.: 16/988,429

(22) Filed: Aug. 7, 2020

(65) Prior Publication Data

US 2021/0242884 A1 Aug. 5, 2021

Related U.S. Application Data

(63) Continuation of application No. 16/777,457, filed on Jan. 30, 2020, now Pat. No. 10,778,248.

(51) Int. Cl.
*H03M 13/00* (2006.01)
*H03M 13/11* (2006.01)

(52) U.S. Cl.
CPC ...... *H03M 13/1111* (2013.01); *H03M 13/116* (2013.01)

(58) Field of Classification Search
CPC .................. H03M 13/1111; H03M 13/116
See application file for complete search history.

(56) References Cited

U.S. PATENT DOCUMENTS

| | | | |
|---|---|---|---|
| 5,572,350 A | 11/1996 | Spanke | |
| 7,383,485 B2* | 6/2008 | Tran | H03M 13/1105 714/780 |
| 7,519,898 B2* | 4/2009 | Narayanan | H03M 13/1191 714/755 |
| 7,583,945 B2 | 9/2009 | McCarthy | |
| 7,669,106 B1 | 2/2010 | Farjadrad | |
| 8,281,210 B1* | 10/2012 | Farjadrad | H03M 13/6583 714/755 |
| 8,407,556 B2* | 3/2013 | Shen | H03M 13/6362 714/755 |
| 8,433,984 B2 | 4/2013 | Khandekar | |

(Continued)

OTHER PUBLICATIONS

Chen et al., Reduced-Complexity Decoding of LDPC Codes, IEEE Transactions on Communications, Aug. 2005, pp. 1288-1299, vol. 53, No. 8.

(Continued)

*Primary Examiner* — Esaw T Abraham
(74) *Attorney, Agent, or Firm* — Van Pelt, Yi & James LLP (57) ABSTRACT

A saturation metric that represents a degree of saturation in a low-density parity-check (LDPC) decoding system that uses a fixed-point number representation is determined. The saturation metric is compared against a saturation threshold. In the event the saturation metric exceeds the saturation threshold, at the end of a decoding iteration, a message is more aggressively attenuated compared to when the saturation metric does not exceed the saturation threshold in order to produce an attenuated message. In the event the saturation metric does not exceed the saturation threshold, at the end of the decoding iteration, the message is less aggressively attenuated compared to when the saturation metric does exceed the saturation threshold in order to produce the attenuated message.

20 Claims, 3 Drawing Sheets

(56) References Cited

U.S. PATENT DOCUMENTS

| | | |
|---|---|---|
| 8,457,194 B2 | 6/2013 | Ali |
| 8,601,352 B1 * | 12/2013 | Anholt ................ H03M 13/618 |
| | | 714/790 |
| 8,739,002 B2 | 5/2014 | Nakamura |
| 8,995,863 B2 * | 3/2015 | Moroi .................... G06F 21/629 |
| | | 399/80 |
| 9,048,870 B2 * | 6/2015 | Li ...................... H03M 13/6331 |
| 9,100,052 B2 * | 8/2015 | Pisek .................... H03M 13/41 |
| 9,246,717 B2 | 1/2016 | Beidas |
| 9,264,073 B2 | 2/2016 | Malmirchegini |
| 9,473,175 B1 * | 10/2016 | Graumann ........ H03M 13/6577 |
| 9,571,168 B2 | 2/2017 | Moon |
| 9,612,903 B2 | 4/2017 | Tehrani |
| 9,716,602 B2 | 7/2017 | Beidas |
| 9,755,666 B2 | 9/2017 | Wu |
| 10,164,663 B2 | 12/2018 | Shin |
| 10,236,070 B2 | 3/2019 | Barndt |
| 2004/0187129 A1 * | 9/2004 | Richardson .......... H03M 13/116 |
| | | 718/100 |
| 2008/0276156 A1 * | 11/2008 | Gunnam .............. H03M 13/116 |
| | | 714/801 |

OTHER PUBLICATIONS

Kanistras et al., Propagation of LLR Saturation and Quantization Error in LDPC Min-Sum Iterative Decoding, 2012 EEE Workshop on Signal Processing Systems, pp. 276-281, 2012.

Kim et al., A Reduced-Complexity Architecture for LDPC Layered Decoding Schemes, IEEE Transactions on Very Large Scale Integration (VLSI) Systems, Jun. 2011, pp. 1099-1103, vol. 19, No. 6.

Mansour et al., High-Throughput LDPC Decoders, IEEE Transactions on Very Large Scale Integration Systems, Dec. 2003, pp. 976-996, vol. 11, No. 6.

Richardson et al., The Capacity of Low-Density Parity-Check Codes Under Message-Passing Decoding, IEEE Transactions on Information Theory, Feb. 2001, pp. 599-618, vol. 47, No. 2.

Zhang et al., Quantized Iterative Message Passing Decoders with Low Error Floor for LDPC Codes, IEEE Transactions on Communications, Jan. 2014, pp. 1-14, vol. 62, No. 1.

Zhang et al., Shuffled Iterative Decoding, IEEE Transactions on Communications, Feb. 2005, pp. 209-213, vol. 53, No. 2.

\* cited by examiner

LOW-DENSITY PARITY-CHECK DECODING WITH DESATURATION

CROSS REFERENCE TO OTHER APPLICATIONS

This application is a continuation of U.S. patent application Ser. No. 16/777,457 (now U.S. Pat. No. 10,778,248, issued Sep. 15, 2020) entitled LOW-DENSITY PARITY-CHECK DECODING WITH DE-SATURATION filed Jan. 30, 2020 which is incorporated herein by reference for all purposes.

BACKGROUND OF THE INVENTION

Low-density parity-check (LDPC) codes are a popular choice for stored data, such as data stored on solid state storage. As storage density increases, the number of errors included in the LDPC-encoded data likewise increases. To compensate for this, new and more powerful LDPC decoding techniques would be desirable. Furthermore, it would be desirable if these new LDPC decoding techniques could be easily implemented in existing storage systems, do not consume substantial amounts of resources (e.g., additional processing, memory, power, etc.), and/or do not introduce noticeable (additional) processing delays.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Various embodiments of a technique to perform LDPC decoding (e.g., by message passing or more specifically min-sum decoding) with de-saturation are described herein. For example, without de-saturation, LDPC systems that use fixed-point number representation can become trapped in some cases if the messages become saturated relative to the fixed-point number representation. In some embodiments, a saturation metric that represents a degree of saturation in a low-density parity-check (LDPC) decoding system that uses fixed-point number representation is determined. The saturation metric is compared against a saturation threshold and it is determined if the saturation metric exceeds the saturation threshold. If so, LDPC decoding data (e.g., one or more messages in the system) is more aggressively attenuated compared to when the saturation metric does not exceed the saturation threshold at the end of a decoding iteration. If not, the LDPC decoding data is less aggressively attenuated at the end of the decoding iteration. The attenuated message may then be passed from a first type of node to a second type of node in a Tanner Graph, assuming more decoding iterations are required to properly decode the LDPC data.

Figure 1:
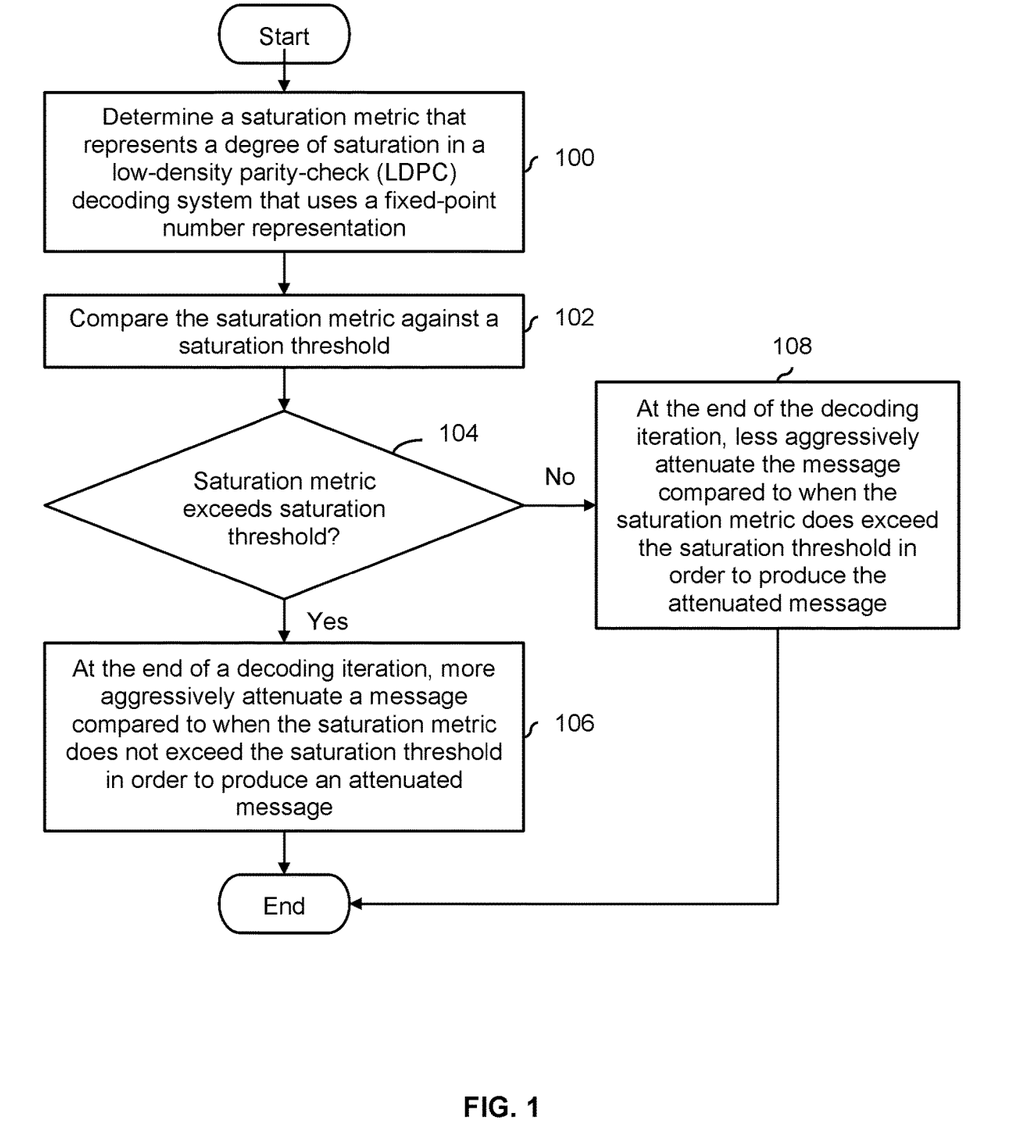
FIG. 1 is a flowchart illustrating an embodiment of min-sum decoding of low-density, parity-check (LDPC) codes with de-saturation.

FIG. 1 is a flowchart illustrating an embodiment of min-sum decoding of low-density, parity-check (LDPC) codes with de-saturation. For example, the process may be performed by an LDPC decoder which processes data which has been encoded using an LDPC code. In various applications, the LDPC-encoded data may have been sent over a (e.g., wireless) communications channel or may have been stored on storage media (e.g., a hard disk drive or solid state storage) before being decoded. As such, the exemplary LDPC decoder may be included in a wireless receiver or a storage read-back module in various embodiments.

At 100 a saturation metric that represents a degree of saturation in a low-density parity-check (LDPC) decoding system that uses a fixed-point number representation is determined. In one example of step 100, the saturation metric is based on the number or percentage of messages (e.g., prior to any message attenuation) from check nodes to variable nodes that are saturated to the maximum fixed-precision magnitude. Alternatively, messages passed in the other direction (e.g., from variable nodes to check nodes) are used to determine the saturation metric at step 100. For example, $l_{min1}^{(j)}$ is the minimum variable node message to check node j and in some embodiments the saturation metric is based at least in part on the number of messages (e.g., across all check nodes j in the system) that are saturated (e.g., to the maximum fixed precision magnitude) at the end of a decoding iteration.

In another example of step 100, the saturation metric is based on a number of saturated nodes in the system. For example, the saturation metric may be the number of saturated check nodes at the end of a decoding iteration. For example, check node j may be declared saturated if $L_{min1}^{(j)}$ (i.e., the minimum attenuated variable node message to check node j where $l_{min1}^{(j)}$ is the message before attenuation and $L_{min1}^{(j)}$ is the message after attenuation) reaches the maximum fixed-precision magnitude.

At 102, the saturation metric is compared against a saturation threshold. In one example, the saturation metric is a percentage and the saturation threshold is within a range of 3/4 (75%)-15/16 (93.75%).

At 104, it is determined if the saturation metric exceeds the saturation threshold. If so, at the end of a decoding iteration, a message is more aggressively attenuated compared to when the saturation metric does not exceed the saturation threshold in order to produce an attenuated message at 106. If not, at the end of a decoding iteration, the message is less aggressively attenuated compared to when the saturation metric does exceed the saturation threshold in order to produce the attenuated message at 108.

In one example of step 106, the messages that are attenuated are the $l_{min1}^{(j)}$ and $l_{min2}^{(j)}$ messages, which are the minimum and second minimum variable node messages to check node j, respectively, before any attenuation or normalization. In this example of step 106, they are more aggressively attenuated using de-saturation attenuation factor $\alpha_{ds}$ and de-saturation attenuation rounding $\beta_{ds}$ (e.g., $l_{min1}^{(j)} = \lfloor \alpha_{ds} \cdot l_{min1}^{(j)} + \beta_{ds} \rfloor$ and $L_{min2}^{(j)} = \lfloor \alpha_{ds} \cdot l_{min2}^{(j)} + \beta_{ds} \rfloor$).

In a corresponding example of step 108, the same messages (i.e., $l_{min1}^{(j)}$ and $l_{min2}^{(j)}$) are less aggressively attenuated using attenuation factor $\alpha$ and attenuation rounding $\beta$ (e.g., $L_{min1}^{(j)} = \lfloor \alpha \cdot l_{min1}^{(j)} + \beta \rfloor$ and $L_{min2}^{(j)} = \lfloor \alpha \cdot l_{min2}^{(j)} + \beta \rfloor$) wherein the desaturation attenuation parameters satisfy the following:

$$\alpha_{ds} < \alpha$$

$$\lfloor \alpha_{ds} + \beta_{ds} \rfloor \leq \lfloor \alpha + \beta \rfloor$$

$$\lfloor \alpha_{ds} L_{max} + \beta_{ds} \rfloor < \lfloor \alpha L_{max} + \beta \rfloor$$

where $L_{max}$ denotes the maximum message magnitude. Furthermore, the parameters $\alpha$, $\beta$, $\alpha_{ds}$, $\beta_{ds}$ can be optimized through density evolution method.

By more aggressively attenuating the messages if the system is saturated (e.g., as measured or otherwise determined using the saturation threshold), the saturation of correct messages is facilitated and error correction over small trapping sets is facilitated, but only if/when needed (e.g., only when the saturation metric exceeds the saturation threshold). More generally, by de-saturating LDPC data if needed, the performance of the LDPC decoder is improved in cases where the data (e.g., the passed messages) would otherwise have saturated and the decoder would trend towards an uncorrectable state.

The attenuated message (e.g., output by step 106 or 108) may then pass from a first type of node (e.g., a variable node) to a second type of node (e.g., a check node) in a Tanner graph, assuming additional LDPC decoding is required. The second type of nodes in the Tanner graph may then send back updated messages to the first type of nodes and the process of FIG. 1 may be repeated as or if needed.

To provide more context for the decoding technique with de-saturation described herein, it may be helpful to discuss check nodes and variable nodes which perform LDPC decoding by passing messages between the nodes. The following figures describe some such examples.

Figure 2A:
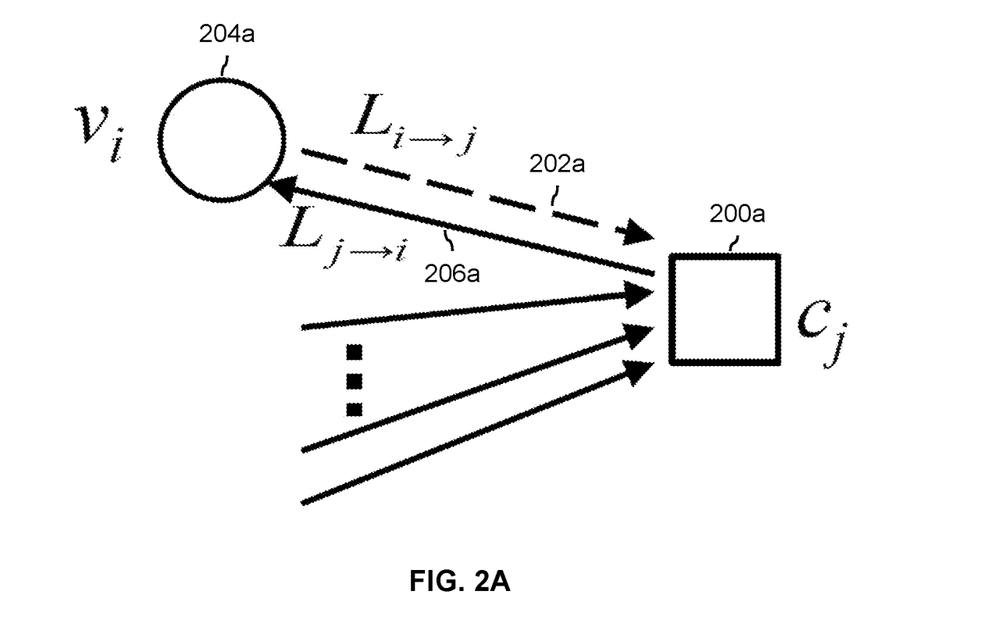
FIG. 2A is a diagram illustrating an embodiment of a check node-to-variable node (CN-to-VN) message update.

FIG. 2A is a diagram illustrating an embodiment of a check node-to-variable node (CN-to-VN) message update. In the example shown here, each check node (e.g., $c_j$ (200a)) in the graph receives log-likelihood ratio (LLR) information (e.g., $L_{i \rightarrow j}$ (202a)) from all of its neighboring variable nodes (e.g., $v_i$ (204a)). Each check node generates an updated check-to-variable message (e.g., $L_{i \rightarrow j}$ (206a)) for a given variable node using the inputs from all other neighboring variable nodes (not shown here).

Low-density parity-check (LDPC) codes are a type of error correction codes and are so named because they have a very low density of 1s in their parity-check matrix (H). This property makes it convenient to represent an LDPC code using a bipartite graph, called a Tanner Graph. There are two types of nodes in a Tanner graph: variable nodes (VNs) and check nodes (CNs). In the example shown here, $v_i$ (204a) is an example of a variable node and $c_j$ (200a) is an example of a check node. Each variable node (or check node) corresponds to a column (or row) of the parity-check matrix, H. As used herein, $V = \{v_1, \ldots, v_n\}$ is the set of variable nodes and $C = \{c_1, \ldots, c_m\}$ is the set of check nodes. Each row of H is indexed by $C = (1, 2, \ldots, m)$ and each column of H is indexed by $V = (1, 2, \ldots, n)$. In the Tanner graph, variable node $v_i$ is connected to check node $c_j$ via an edge if $H_{j,i} = 1$ and the set of edges on the Tanner graph is denoted by set E.

Quasi-cyclic low-density parity-check (QC-LDPC) codes are a special class of the LDPC codes with structured H matrix which can be generated by the expansion of an $m_b \times n_b$ base matrix. Each 1s element in the base matrix can be expanded by a circularly right-shifted b×b identity submatrix. QC-LDPC codes have advantages over other types of LDPC codes in terms of hardware implementations on both the encoding and decoding side. Encoding of a QC-LDPC code can be (more) efficiently implemented (e.g., in hardware) using simple shift registers. In a hardware implementation of a QC-LDPC decoder, the QC structure of the code simplifies the wire routing for message passing.

Figure 2B:
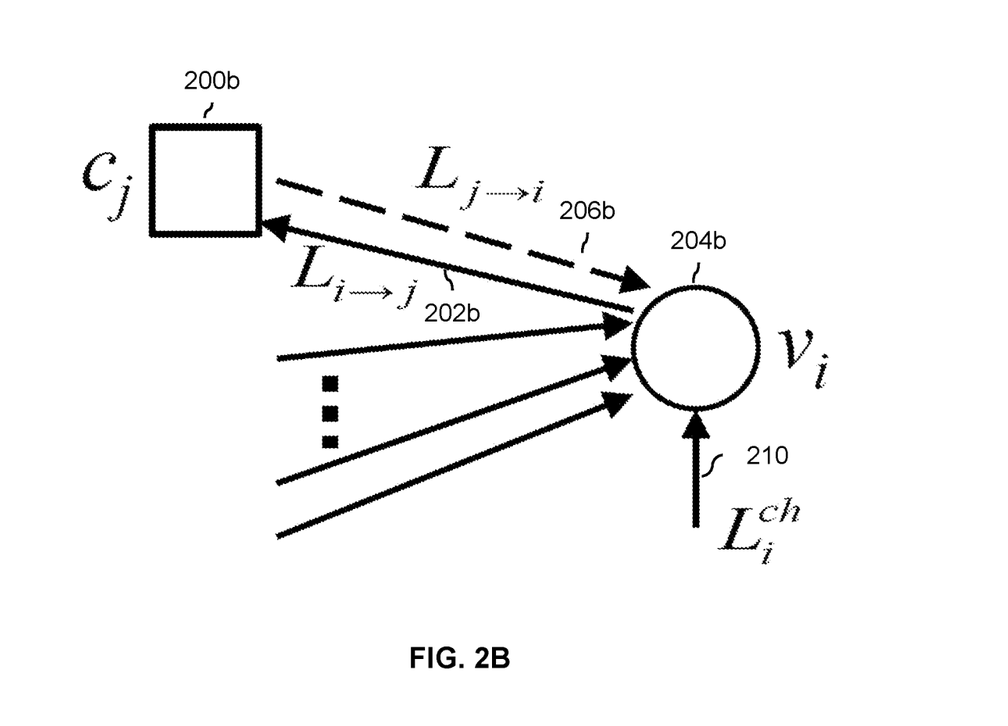
FIG. 2B is a diagram illustrating an embodiment of a variable node-to-check node (VN-to-CN) message update.

It may be helpful to describe message passing in more detail. The following figure shows an example of a variable node-to-check node message update, which is part of message passing (i.e., a type of LDPC decoding).

FIG. 2B is a diagram illustrating an embodiment of a variable node-to-check node (VN-to-CN) message update. In the example shown here, each variable node (e.g., $v_i$ (204b)) in the graph receives LLR information (e.g., (206b)) from all of its neighboring check nodes (e.g., $c_j$ (200b)). Each variable node (e.g., $v_i$ (204b)) generates an updated variable-to-check message (e.g., $L_{i \rightarrow j}$ (202b)) to a given check node (e.g., $c_j$ (200b)) using the inputs from all other neighboring check nodes (not shown).

Message-passing (MP) is an efficient technique to achieve near-optimal decoding of LDPC codes. For notational conciseness, a variable node is referred to subsequently simply as i (instead of $v_i$) and j (instead of $c_j$) is used to denote a check node. As shown in this example, a variable node i (204b) receives an input message $L_i^{ch}$ (210) from the channel. For example, this message from the channel may be the log-likelihood ratio (LLR) of the corresponding channel output, defined as follows:

$$L_i^{ch} = \log\left(\frac{Pr(R_i = r_i | c_i = 0)}{Pr(R_i = r_i | c_i = 1)}\right), \quad (1)$$

where $c_i \in \{0,1\}$ is the code bit and $r_i$ is the corresponding received symbol.

A conventional iterative message passing decoder alternates between two phases: a CN-to-VN phase (during which check nodes send messages to their adjacent variable nodes) and a VN-to-CN phase (during which variable nodes send messages to check nodes along their adjacent edges) which are depicted schematically in FIGS. 2A and 2B, respectively. In the initialization step of the decoding process, variable node i forwards the same message to all of its neighboring check nodes V(i), namely the LLR $L_i^{ch}$ derived from the corresponding channel output. In the CN-to-VN message update phase, check node j uses the incoming messages and check node update rule to compute and forward, to variable node i∈C(j), a new CN-to-VN message, $L_{j \to i}$. Variable node i then processes its incoming messages according to the variable node update rule and forwards to each adjacent check node, C(i), an updated VN-to-CN message, $L_{i \to j}$. After a pre-specified number of iterations, variable node i sums all of the incoming LLR messages to produce an estimate of the corresponding code bit i. Note that all of the CN-to-VN message updates can be done in parallel, as can all of the VN-to-CN message updates. This enables efficient, high-speed software and/or hardware implementations of iterative message-passing decoding processing.

Let $L_{i \to j}$ and $L_{j \to i}$ represent the messages sent from variable node i to check node j and from check node j to variable node i, respectively. Let C(i) be the set of check nodes directly connected to variable node i and V(J) be the set of variable nodes directly connected to check node j. Then, the message sent from variable node i to check node j in sum-product decoding is given by:

$$L_{i \to j} = L_i^{ch} + \sum_{j' \in C(i) \setminus j} L_{j' \to i}, \quad (2)$$

and the message from check node j to variable node i is computed as:

$$L_{j \to i} = 2\tanh^{-1}\left( \prod_{i' \in V(j) \setminus i} \tanh \frac{L_{i' \to j}}{2} \right). \quad (3)$$

Let $P_i$ be a posterior probability (APP) message of variable node i where:

$$P_i = L_i^{ch} + \sum_{j' \in C(i)} L_{j' \to i}. \quad (4)$$

In this example, a variable node receives the log-likelihood ratios of received information from the channel as an initial input message (i.e., $L_{i \to j} = L_i^{ch}$) and the following equivalent check node update rule is employed:

$$L_{j \to i} = \left[ \prod_{i' \in V(j) \setminus i} \text{sign}(L_{i' \to j}) \right] \cdot \left[ \alpha \cdot \min_{i' \in V(j) \setminus i} |L_{i' \to j}| + \beta \right], \quad (5)$$

where 0<α<1, β>0 is the attenuation factor and attenuation rounding, respectively, which can be either pre-fixed or dynamically adjusted. Herein we newly introduced the attenuation rounding parameter β, which satisfies the following:

$$1 \leq \alpha + \beta < 2$$

which prevents a minimum CN-to-VN message of 1 from being attenuated to zero (which would erase any information contained therein).

It is noted that channel LLR inputs may be conveniently scaled for min-sum decoding but preferably are precise for the original sum-product decoding. With that in mind, the following notations are used to simplify the above calculation. Let:

$$S_{i \to j} \triangleq \text{sign}(L_{i \to j}). \quad (7)$$

Let $S^{(j)}$ be the product sign of all variable nodes i to the check node j:

$$S^{(j)} \triangleq \prod_{i' \in V(j)} S_{i' \to j}. \quad (8)$$

Let $l_{min1}^{(j)}$ and $i_{min1}^{(j)}$ be the minimum variable node message to check node j and its associated index, respectively:

$$l_{min1}^{(j)} \triangleq \min_{i' \in V(j)} |L_{i' \to j}|, \; i_{min1}^{(j)} \triangleq \arg\min_{i' \in V(j)} |L_{i' \to j}| \quad (9)$$

and let $l_{min2}^{(j)}$ be the second minimum variable node message to check node j:

$$l_{min2}^{(j)} \triangleq \min_{i' \in V(j) \setminus i_{min1}^{(j)}} |L_{i' \to j}|. \quad (10)$$

Furthermore, let $L_{min1}^{(j)}$ and $L_{min2}^{(j)}$ be the attenuated minimum and second minimum variable node message, respectively, to the check node j:

$$L_{min1}^{(j)} \triangleq \lfloor \alpha \cdot l_{min1}^{(j)} + \beta \rfloor, L_{min2}^{(j)} \triangleq \lfloor \alpha \cdot l_{min2}^{(j)} + \beta \rfloor \quad (11)$$

With the above notations, Equation (5) can be conveniently rewritten as:

$$L_{j \to i} = S^{(j)} \cdot S_{i \to j} \cdot \begin{cases} L_{min1}^{(j)}, & \text{if } i \neq i_{min1}^{(j)} \\ L_{min2}^{(j)}, & \text{if } i = i_{min1}^{(j)} \end{cases}. \quad (12)$$

Pseudocode 1 describes a hardware amenable min-sum decoding example along these lines. It is noted that Pseudocode 1 does not de-saturate (e.g., unlike FIG. 1 and other embodiments described herein) and so Pseudocode 1 is vulnerable to becoming trapped in an uncorrectable state if the passed messages were to saturate at the maximum fixed-precision magnitude.

---

Pseudocode 1: Example of Flooded Min-Sum Decoding Without De-Saturation

Initialization: $L_{min1}^{(j)} = L_{min2}^{(j)} = 0, \forall j \in \mathcal{C}$
Iteration:
1: $l_{min1}^{(j)} = l_{min2}^{(j)} = \infty, i_{min1}^{(j)} = 0, S_j = 0, \forall j \in \mathcal{C}$
2: for $\forall i \in \mathcal{V}$, do
3:    for $\forall j \in \mathcal{C}(i)$, do Pseudocode 1: Example of Flooded Min-Sum Decoding Without De-Saturation 4:   Read (old) $\{S^{(j)}, i_{min1}^{(j)}, L_{min1}^{(j)}, L_{min2}^{(j)}\}$ 5:   Compute $L_{j \to i} \leftarrow \begin{cases} S^{(j)} \cdot S_{i \to j} \cdot L_{min1}^{(j)}, \text{ if } i \neq i_{min1}^{(j)} \\ S^{(j)} \cdot S_{i \to j} \cdot L_{min2}^{(j)}, \text{ if } i = i_{min1}^{(j)} \end{cases}$ 6:   end for
7:   Compute $P_i \leftarrow L_i^{ch} + \Sigma_{j \in C(i)} L_{j \to i}$
8:   for $\forall j \in C(i)$, do
9:     Compute $L_{i \to j} \leftarrow P_i - L_{j \to i}$
10:    Store (new) $S_{i \to j} \leftarrow \text{sign}(L_{i \to j})$
11:    Compute (new) $S^{(j)} \leftarrow S^{(j)} \oplus S_{i \to j}$
12:    Compute (new) $\{i_{min1}^{(j)}, l_{min1}^{(j)}, l_{min2}^{(j)}\} \leftarrow \{i_{min1}^{(j)}, l_{min1}^{(j)}, l_{min2}^{(j)}, \{i, |L_{i \to j}|\}\}$
13:   end for
14: end for
15: Compute syndrome $\text{sign}([P_1, P_2, ..., P_n]) \cdot H^T$. If 0 then return the codeword $\text{sign}([P_1, P_2, ..., P_n])$.
16: Normalize $L_{min1}^{(j)} = \lfloor \alpha \cdot l_{min1}^{(j)} + \beta \rfloor$, $L_{min2}^{(j)} = \lfloor \alpha \cdot l_{min2}^{(j)} + \beta \rfloor$, $\forall j \in C$.

When a QC-LDPC code with b×b circulants is in use, each circulant of b bits is updated independently and in parallel.

The paper "Propagation of LLR saturation and quantization error in LDPC min-sum iterative decoding" by KANISTRAS et al. (which does not describe the de-saturation approach described in FIG. 1) investigated the theoretical aspect of saturation effect but did not propose any de-saturation technique.

In "Quantized iterative message passing decoders with low error floor for LDPC codes" by ZHANG et al., a new non-uniform quantization method was proposed to extend the message quantization range by using an exponentially increased step size for large magnitudes while keeping a fixed step size for small magnitudes. However, the proposed exponentially increased step size design is difficult to implement in hardware. In contrast, the de-saturation decoding technique described in FIG. 1 is amenable to hardware implementation and does not use an exponentially increased vs. fixed step size.

In U.S. Pat. No. 9,755,666 by Yingquan Wu, CN-to-VN messages are halved (e.g., by the variable node in the middle of a decoding iteration) if a significant fraction of VN-to-CN messages are saturated. For example, this would correspond to having a new line between line 5 and line 6 in Pseudocode 1 (not shown) where is halved (i.e., set to $L_{j \to i}$ to $L_{j \to i}/2$) if some saturation condition is flagged. However, halving the CN-to-VN messages at that stage (i.e., in the middle of a VN-to-CN message update) as opposed to at the end of a decoding layer/iteration results in longer critical (e.g., rate limiting) path and thus slower clock speed. For example, there may be a critical timing path that begins with reading or otherwise inputting some piece of data or variable (e.g., at line 4 in Pseudocode 1) and ending with computing new values for that piece of data or value (e.g., at lines 12 and/or 13 in Pseudocode 1) and the older technique of halving $L_{j \to i}$ (e.g., which would occur between lines 5 and 6 in Pseudocode 1 but which is not shown there) introduces additional delay into a critical timing path. Furthermore, halving is a crude way of attenuating information and it may not be necessary to apply that much attenuation even if saturation is detected in the system. By using two de-saturation attenuation parameters (e.g., $\alpha_{ds}$ as well as $\beta_{ds}$), sufficient attenuation can be achieved without losing as much information as halving does. In one example, $$\alpha_{ds} = \frac{3}{4}\alpha \text{ and } \beta_{ds} = \frac{3}{4}\beta.$$

If iterative message-passing decoding is implemented in hardware, the decoding efficiency can be improved using a layered decoding approach. In layered decoding, check node messages are updated serially. That is, instead of sending all messages from variable nodes to check nodes, and then all messages from check nodes to variable nodes (i.e., flooding), the layered coding goes through the check nodes in sequential order such that, to each check node being updated, all messages are sent in and processed, and then sent out to neighboring variable nodes. Such scheduled serial updating of check nodes enables immediate propagation of the newly updated message, unlike the flooded scheme where the updated messages can propagate only in the next iteration.

As a result, layered decoding improves convergence speed by roughly twice compared to that of a flooded implementation. Moreover, it provides a good trade-off between speed and memory. This is achieved by iterating over dynamic CN-to-VN messages, denoted by $Q \triangleq [Q_1, Q_2, \ldots, Q_n]$. Specifically, let variable node $i \in V(j)$, then $Q_i$ over a layer j is defined as:

$$Q_i^{(j)} \triangleq L_{j \to i} = L_i^{ch} + \sum_{j' \in C(i) \setminus j} L_{j' \to i}^{(last)}, \qquad (13)$$

where the superscript $^{(last)}$ denotes the latest updated. It is worth noting that, in layered decoding, the VN-to-CN message updated at the last layer (all but the last are from the current iteration) is utilized to update the CN-to-VN $Q_i$ in the current layer, whereas in the flooded decoding updating a CN-to-VN message $L_{j \to i}$ utilizes the VN-to-CN messages each generated at the last iteration. The $Q \triangleq [Q_1, Q_2, \ldots, Q_n]$ memory is initialized with the channel messages $L^{ch} \triangleq [L_1^{ch}, L_2^{ch}, \ldots, L_n^{ch}]$ and no dedicated memory is needed to store $L^{ch}$, whereas with flooded decoding, $L^{ch}$ is stored but not Q. $Q_i$, $i=1, 2, \ldots, n$, is iteratively calculated as follows. Let j be the current layer and $j_i$ be the preceding layer associated with variable node i. A preceding layer is mathematically declared or otherwise defined as follows. Let $j_1 < j_2 < \ldots < j_k$ be all check nodes directly connected to variable node i, then $j_l$ is the preceding layer of $j_{l+1}$ for l=1, 2, . . . , k−1, and $j_k$ is the preceding layer of $j_l$.

The APP (i.e., a posterior probability) message $P_i$ at the layer j is calculated as:

$$P_i^{(j)} = Q_i^{(j_i)} + L_{j_i \to i}^{new} \quad (14)$$

where $L_{j_i \to i}^{new}$ is newly updated and $Q_i$ is iteratively updated by:

$$Q_i^{(j)} = P_i^{(j)} - L_{j \to i}^{old}, \quad (15)$$

where $L_{j_i \to i}^{old}$ was saved during the preceding iteration. The layered decoding can be applied to all types of iterative message-passing decoding, including SAP and min-sum decoding. A hardware amenable layered min-sum decoding process is described below in Pseudocode 2. It is noted that Pseudocode 2 does not check for de-saturation and perform de-saturation on the LDPC data, if needed (see, e.g., FIG. 1) and so Pseudocode 2 is vulnerable to becoming trapped in an uncorrectable state if the passed messages were to saturate at the maximum fixed-precision magnitude.

between lines 7 and 8 which would halve $P_i$ if $I_{ds}$ equals one and variable node i is being visited or iterated through for the first time. There would also be a new line (not shown) in Pseudocode 2 between lines 9 and 10 which would halve $L_{j \to i}^{old}$. However, as described above, there are drawbacks to doing the de-saturation in the middle of CN-to-VN message update and halving the messages may attenuate the message to an unnecessary degree (e.g., just a little more attenuation than would otherwise or normally be applied is sufficient).

During simulations with Pseudocode 1 and 2 (or the like), it was observed that the range of messages passed between variable nodes and check nodes in the decoder has direct impact on the decoding performance in terms of both converge speed and error rate. When fixed-point magnitude was not enforced, correct messages typically grew faster than incorrect messages, with most errors due to small trapping sets correctable. However, given limited precision in practice (e.g., five bits of representation), after a certain number of iterations, messages tended to saturate to the maximum fixed-point magnitude. In such scenarios, correct

---

Pseudocode 2: Example of Layered Min-Sum Decoding Without De-Saturation

---

Initialization: $L_{min1}^{(j)} = L_{min2}^{(j)} = 0, \forall j \in \mathcal{C}$ ; $Q_i = L_i^{ch}, \forall i \in \mathcal{V}; \mathcal{L}=0$ Iteration:

1: for $\mathcal{J} = 0, 1, 2 ..., m − 1$ do
2:    for $\forall j \in \mathcal{J}$ do
3:       $l_{min1}^{(j)} = l_{min2}^{(j)} = \infty, i_{min1}^{(j)} = 0, S_j = 0$
4:       for $\forall i \in \mathcal{V}(j)$ do
5:          Read (new) $\{S^{(j)}_i, i_{min1}^{(j)}_i, L_{min1}^{(j)}_i, L_{min2}^{(j)}_i\}$ where $j_i$ is the preceding layer of VN i 6:          Compute $L_{j_i \to i}^{new} \leftarrow \begin{cases} S^{(j_i)} \cdot S_{i \to j_i} \cdot Ll_{min1}^{(j_i)}, & \text{if } i \neq i_{min1}^{(j_i)} \\ S^{(j_i)} \cdot S_{i \to j_i} \cdot Ll_{min2}^{(j_i)}, & \text{if } i = i_{min1}^{(j_i)} \end{cases}$ 7:          Compute $P_i \leftarrow Q_i + L_{j_i \to i}^{new}$
8:          Read (old) $\{S^{(j)}, i_{min1}^{(j)}, L_{min1}^{(j)}, L_{min2}^{(j)}\}$ 9:          Compute $L_{j \to i}^{old} \leftarrow \begin{cases} S^{(j)} \cdot S_{i \to j} \cdot L_{min1}^{(j)}, & \text{if } i \neq i_{min1}^{(j)} \\ S^{(j)} \cdot S_{i \to j} \cdot L_{min2}^{(j)}, & \text{if } i = i_{min1}^{(j)} \end{cases}$ 10:         Compute $Q_i \leftarrow P_i - L_{j \to i}^{old}$.
11:         Store $S_{i \to j} = \text{sign}(Q_i)$
12:         Compute (new) $S^{(j)} \leftarrow S^{(j)} \oplus S_{i \to j}$
13:         Compute (new) $\{i_{min1}^{(j)}, l_{min1}^{(j)}, l_{min2}^{(j)}\} \leftarrow \{i_{min1}^{(j)}, l_{min1}^{(j)}, l_{min2}^{(j)}, \{i, |Q_i|\}\}$
14:       end for
15:       Compute syndrome $\text{sign}([P_1, P_2, ..., P_n]) \cdot H^T$. If 0, then return the codeword $\text{sign}([P_1, P_2, ..., P_n])$.
16:    end for
17:    Normalize $L_{min1}^{(j)} = \lfloor \alpha \cdot l_{min1}^{(j)} + \beta \rfloor, L_{min2}^{(j)} = \lfloor \alpha \cdot l_{min2}^{(j)} + \beta \rfloor, j \in \mathcal{J}$
18: end for

---

When a QC-LDPC code with b×b circulants is in use, b quasi-cyclic rows of H are (naturally) treated as a layer. That is, a layer contains b check nodes, each being updated independently and in parallel. It is noted that convergence may occur within any layer for layered min-sum decoding (one example of which is shown in Pseudocode 2) whereas the convergence must occur at the end of an iteration for the flooded min-sum decoding (one example of which is shown in Pseudocode 1). Moreover, layered decoding enables or otherwise permits utilization of updated CN-to-VN messages within an iteration whereas it is not possible for flooded decoding. Consequently, layered decoding converges roughly twice as fast as flooded decoding.

As described above, in one alternate approach to FIG. 1, values are halved in the middle of a layered decoding iteration in a crude attempt to de-saturate. For example, in Pseudocode 2, this would include a new line (not shown)

messages are not able to outweigh incorrect messages, and the message in passing is gradually downgraded to bipolar messages.

From this observation, new and improved adaptive quantization methods have been developed (see, e.g., FIG. 1). In some embodiments, to expand the range of represented values by message index, the messages are scaled down after (or if) certain criterion is met. For example, but not limited to, if at the end of an iteration the number of saturated check nodes, denoted by $\theta_C$, is greater than a pre-defined threshold, denoted by $\Theta$, then all CN-to-VN messages in the decoder are more aggressively attenuated which effectively ameliorates the saturation during the next iteration. Herein, a check node j is declared saturated if $L_{min1}^{(j)}$ reaches the maximum finite-precision magnitude.

This enables an effective increase in the quantization range without (meaningfully) increasing complexity or memory. Pseudocode 3 shows an example of flooded decoding with de-saturation.

Pseudocode 3: Example of De-saturated Flooded Min-Sum Decoding

Initialization: $L_{min1}^{(j)} = L_{min2}^{(j)} = 0, \forall j \in \mathcal{C}$
Iteration:
1: $l_{min1}^{(j)} = l_{min2}^{(j)} = \infty, i_{min1}^{(j)} = 0, S_j = 0, \forall j \in \mathcal{C}$
2: for $\forall i \in \mathcal{V}$, do
3:   for $\forall j \in \mathcal{C}(i)$, do
4:     Read (old) $\{S^{(j)}, i_{min1}^{(j)}, L_{min1}^{(j)}, L_{min2}^{(j)}\}$ 5:     Compute $L_{j \to i} \leftarrow \begin{cases} S^{(j)} \cdot S_{i \to j} \cdot L_{min1}^{(j)}, \text{ if } i \neq i_{min1}^{(j)} \\ S^{(j)} \cdot S_{i \to j} \cdot L_{min2}^{(j)}, \text{ if } i = i_{min1}^{(j)} \end{cases}$ 6:   end for
7:   Compute $P_i \leftarrow L_i^{ch} + \Sigma_{j \in C(i)} L_{j \to i}$
8:   for $\forall j \in \mathcal{C}(i)$, do
9:     Compute $L_{j \to i} \leftarrow P_i - L_{j \to i}$
10:     Store (new) $S_{i \to j} \leftarrow \text{sign}(L_{i \to j})$
11:     Compute (new) $S^{(j)} \leftarrow S^{(j)} \oplus S_{i \to j}$
12:     Compute (new) $\{i_{min1}^{(j)}, l_{min1}^{(j)}, l_{min2}^{(j)}\} \leftarrow \{i_{min1}^{(j)}, l_{min1}^{(j)}, l_{min2}^{(j)}, \{i, |L_{i \to j}|\}\}$
13:   end for
14: end for
15: Compute syndrome $\text{sign}([P_1, P_2, ..., P_n]) \cdot H^T$. If 0 then return the codeword $\text{sign}([P_1, P_2, \ldots, P_n])$.
16: If the number of saturated $l_{min1}$ is greater than $\Theta$, then set $I_{ds} = 1$, otherwise 0.
17: If $I_{ds} = 0$ then normalize $L_{min1}^{(j)} = \lfloor \alpha \cdot l_{min1}^{(j)} + \beta \rfloor, L_{min2}^{(j)} = \lfloor \alpha \cdot l_{min2}^{(j)} + \beta \rfloor$, otherwise de-saturate $L_{min1}^{(j)} = \lfloor \alpha_{ds} \cdot l_{min1}^{(j)} + \beta_{ds} \rfloor, L_{min2}^{(j)} = \lfloor \alpha_{ds} \cdot l_{min2}^{(j)} + \beta_{ds} \rfloor, \forall j \in \mathcal{C}$.

---

Pseudocode 3 shows one example of how the process of FIG. 1 may be performed. Although not explicitly stated in Pseudocode 3, the process may end if the syndrome equals 0 and the codeword is returned at line 15 (e.g., because decoding has successfully completed and there is no need to continue). As described above, it may be beneficial to do the de-saturation (e.g., more aggressively attenuate a message or other data) at the end of the iteration because it does not affect the existing pipelining stages and critical (timing) path. Also, the de-saturation parameters $\alpha_{ds}$ and $\beta_{ds}$ may be able to achieve a better de-saturation compared to crudely halving values (e.g., which may attenuate the messages or data to an unnecessary degree).

Figure 3:
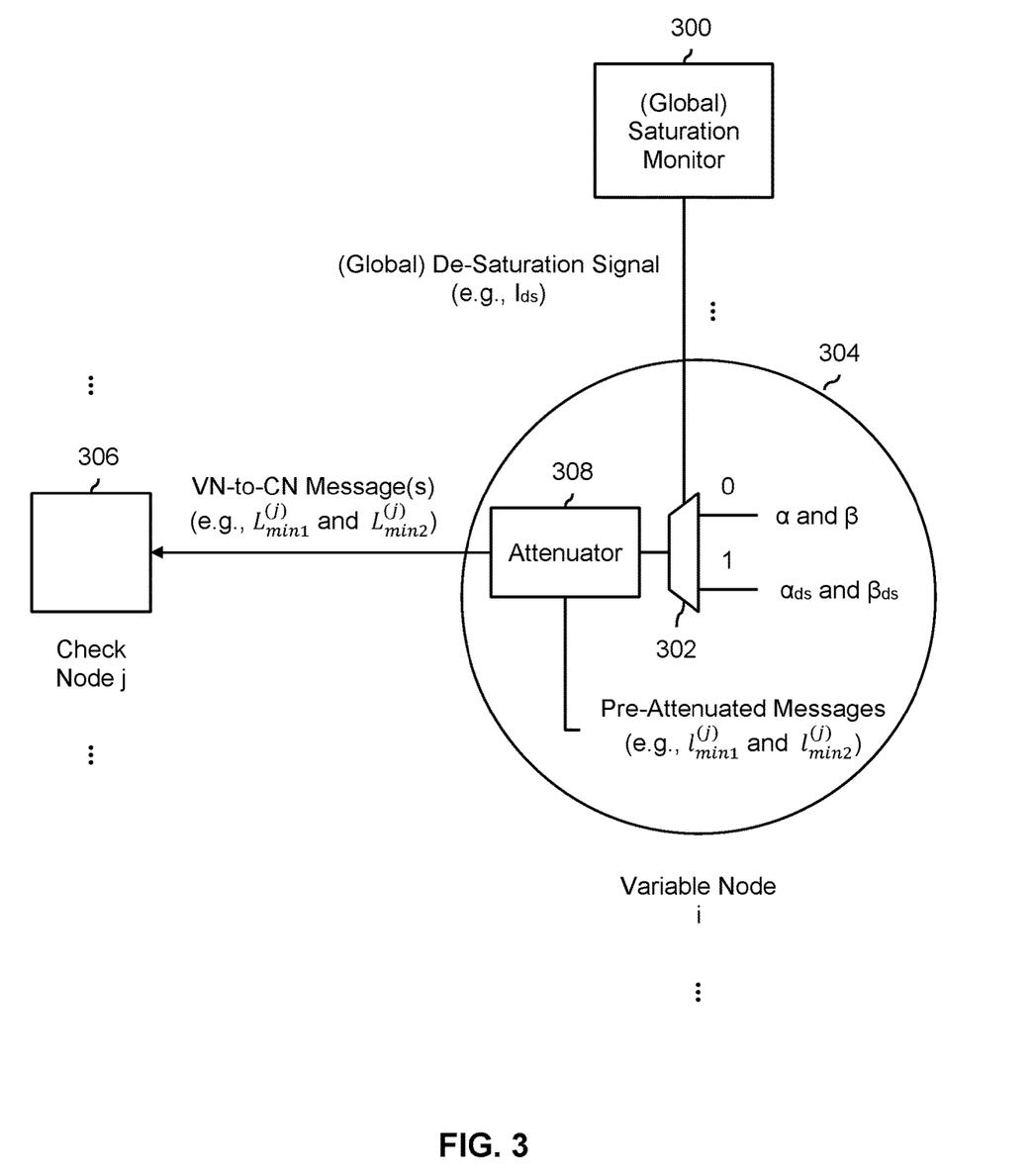
FIG. 3 is a system diagram illustrating an embodiment of a de-saturated min-sum decoding.

The following figure shows an example system diagram which performs the process of Pseudocode 3.

FIG. 3 is a system diagram illustrating an embodiment of a de-saturated min-sum decoding. In the example shown, the system diagram is applicable to both de-saturated flooded min-sum decoding as well as de-saturated layered min-sum decoding. In this example, a (global) saturation monitor (300) generates a (global) de-saturation signal (e.g., $I_{ds}$) which is passed to all of the variable nodes in the system, including the variable node shown here (304). For example, the $I_{ds}$ signal referred to in lines 16 and 17 of Pseudocode 3 corresponds to this signal.

The de-saturation signal controls a plurality of multiplexers, including the multiplexer shown here (302). If the de-saturation signal equals zero, then the multiplexer (302) selects the less aggressive attenuation parameters of $\alpha$ and $\beta$ to pass on to the attenuator block (308) which uses the selected attenuation parameters to attenuate messages (e.g., $l_{min1}^{(j)}$ and $l_{min2}^{(j)}$). If the de-saturation signal instead equals one, then the multiplexer (302) selects the more aggressive attenuation parameters of $\alpha_{ds}$ and $\beta_{ds}$ to output to the attenuator (308). In some embodiments, $\alpha_{ds}$ is within a range of $$\frac{1}{2}\alpha \text{ and } \frac{3}{4}\alpha$$

and $\beta_{ds}$ is within a range of $$\frac{1}{2}\beta \text{ and } \frac{3}{4}\beta.$$

The attenuated messages which are output by the attenuation block (308) are then passed from the variable node i (304) to the check node j (306) as VN-to-CN messages (e.g., $L_{min1}^{(j)}$ and $L_{min2}^{(j)}$) assuming another iteration of decoding needs to be performed (e.g., because the syndrome is not all zeros which indicates that LDPC decoding has not yet successfully completed).

Returning briefly to FIG. 1, the saturation monitor (300) is one example of a device that performs steps 100 and 102 in FIG. 1 and the multiplexer (302) and attenuator (308) are examples of devices that perform steps 104, 106, and 108 in FIG. 1. It is noted that this system diagram is merely exemplary and is not intended to be limiting. For example, it is logically equivalent to have two attenuation blocks (e.g., one that outputs less aggressively attenuated messages and one that outputs more aggressively attenuated messages) and have the multiplexer follow the attenuation blocks.

As described above, unlike some other techniques (e.g., a system which alternates between an exponentially increased step size and fixed step size), adding a saturation monitor (300) and a plurality of multiplexers (e.g., the multiplexer (302) shown here) to an existing (min-sum) LDPC decoding system is relatively easy to implement in hardware.

For completeness, Pseudocode 4 shows an example of layered min-sum decoding with de-saturation.

---
Pseudocode 4: Example of De-saturated Layered Min-Sum Decoding
---
Initialization: $L_{min1}^{(j)} = L_{min2}^{(j)} = 0, \forall j \in \mathcal{C}; Q_i = L_i^{ch}, \forall i \in \mathcal{V}; \mathcal{L}=0; I_{ds} = 0$
Iteration:
 1: for $\mathcal{J}=0, 1, 2, ..., m - 1$ do
 2:   for $\forall j \in \mathcal{J}$ do
 3:     $l_{min1}^{(j)} = l_{min2}^{(j)} = \infty, i_{min1}^{(j)} = \emptyset, S_j = 0$
 4:     for $\forall i \in \mathcal{V}(j)$ do
 5:       Read (new) $\{S_i^{(j_i)}, i_{min1}{}_i^{(j_i)}, L_{min1}{}_i^{(j_i)}, L_{min2}{}_i^{(j_i)}\}$ where $j_i$ is the preceding layer of VN i 6:       Compute $L_{j_i \rightarrow i}^{new} \leftarrow \begin{cases} S^{(j_i)} \cdot S_{i \rightarrow j_i} \cdot L_{min1}^{(j_i)}, & \text{if } i \neq i_{min1}^{(j_i)} \\ S^{(j_i)} \cdot S_{i \rightarrow j_i} \cdot L_{min2}^{(j_i)}, & \text{if } i = i_{min1}^{(j_i)} \end{cases}$ 7:       Compute $P_i \leftarrow Q_i + L_{j_i \rightarrow i}^{new}$
 8:       Read (old) $\{S^{(j)}, i_{min1}^{(j)}, L_{min1}^{(j)}, L_{min2}^{(j)}\}$.

9:       Compute $L_{j \rightarrow i}^{old} \leftarrow \begin{cases} S^{(j)} \cdot S_{i \rightarrow j} \cdot L_{min1}^{(j)}, & \text{if } i \neq i_{min1}^{(j)} \\ S^{(j)} \cdot S_{i \rightarrow j} \cdot L_{min2}^{(j)}, & \text{if } i = i_{min1}^{(j)} \end{cases}$ 10:       Compute $Q_i \leftarrow P_i - L_{j \rightarrow i}^{old}$.
11:       Store $S_{i \rightarrow j} = \text{sign}(Q_i)$
12:       Compute (new) $S^{(j)} \leftarrow S^{(j)} \oplus S_{i \rightarrow j}$
13:       Compute (new) $\{i_{min1}^{(j)}, l_{min1}^{(j)}, l_{min2}^{(j)}\} \leftarrow \{i_{min1}^{(j)}, l_{min1}^{(j)}, l_{min2}^{(j)}, \{i, |Q_i|\}\}$
14:     end for
15:     Compute syndrome $\text{sign}([P_1, P_2, ..., P_n]) \cdot H^T$. If 0 then return the codeword $\text{sign}([P_1, P_2, ..., P_n])$.
16:   end for
17:   If $I_{ds} = 0$ then normalize $L_{min1}^{(j)} = \lfloor \alpha \cdot l_{min1}^{(j)} + \beta \rfloor, L_{min2}^{(j)} = \lfloor \alpha \cdot l_{min2}^{(j)} + \beta \rfloor$, otherwise de-saturate
     $L_{min1}^{(j)} = \lfloor \alpha_{ds} \cdot l_{min1}^{(j)} + \beta_{ds} \rfloor, L_{min2}^{(j)} = \lfloor \alpha_{ds} \cdot l_{min2}^{(j)} + \beta_{ds} \rfloor, j \in \mathcal{J}$
18:   If $\mathcal{J} = 0$ and overall number of saturated $l_{min1}$ is greater than a pre-determined threshold $\Theta$,
     then set $I_{ds} = 1$, otherwise 0.
19: end for

---

Pseudocode 4 shows one example of how the process of FIG. 1 may be performed. Although not explicitly described in the pseudocode, the process of Pseudocode 4 may end after line 15 if the syndrome equals 0 (which indicates that LDPC decoding has successfully completed and therefore further processing is unnecessary). And as with Pseudocode 3, the attenuation in Pseudocode 4 is done at the end of the iteration (e.g., at line 17) using the parameters $\alpha_{ds}$ and $\beta_{ds}$ which may be beneficial in at least some applications.

Although some of the examples described herein show flooded min-sum decoding and layered min-sum decoding, the techniques described herein may be extended to other variants of message-passing decoding of LDPC codes (e.g., shuffled decoding which has efficiency between that of flooded decoding and layered decoding).

In some embodiments, the decoder selects the degree of de-saturation applied (e.g., at step 106 in FIG. 1). For example, in some cases, it may be desirable to more aggressively attenuate a message with de-saturation parameters of $$\alpha_{ds} = \frac{3}{4}\alpha \text{ and } \beta_{ds} = \frac{3}{4}\beta$$

at step 106 in FIG. 1 whereas in other cases it may be more desirable to use de-saturation parameters of $$\alpha_{ds} = \frac{1}{2}\alpha \text{ and } \beta_{ds} = \frac{1}{2}\beta$$

at step 106 because a larger degree of de-saturation and/or attenuation is called for given the state of the system.

In some embodiments, such a selection of de-saturation parameters (e.g., for use at step 106 in FIG. 1) is done by density evolution optimization. For example, density evolution is used to analyze the convergence behavior of the min-sum decoder (e.g., the code threshold) for a given LDPC code ensemble under min-sum decoding, where the code threshold is defined as the maximum channel noise level at which the decoding error probability converges to zero as the code length goes to infinity. Density evolution is used to determine the performance of min-sum decoding for a given code ensemble by tracking the probability density function (PDF) of messages passed along the edges in the corresponding Tanner graph through the iterative decoding process. Then, it is possible to test whether, for a given channel condition and a given degree distribution, the decoder can successfully decode the transmitted message (with the decoding error probability tends to zero as the iterations progress). Using density evolution as an evaluation tool, various de-saturation parameters (e.g., any of $\alpha$, $\alpha_{ds}$, $\beta$, and/or $\beta_{ds}$) may be tested and optimized values for any of $\alpha$, $\alpha_{ds}$, $\beta$, and/or $\beta_{ds}$ may be selected.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A decoder, comprising:
 a saturation monitor configured to:
  generate a global de-saturation control signal that is determined based at least in part on a saturation threshold and a degree of saturation in a low-density parity-check (LDPC) decoding system that uses a fixed-point number representation;
 plurality of variable nodes that is configured to:
  in the event the global de-saturation control signal is a first value, output a more aggressively attenuated message to a plurality of check nodes compared to when the global de-saturation control signal is a second value; and in the event the global de-saturation control signal is the second value, output a less aggressively attenuated message to the plurality of check nodes compared to when the global de-saturation control signal is the first value; and the plurality of check nodes.

2. The decoder recited in claim 1, wherein the degree of saturation is based at least in part on a number of messages, passed between at least one of the plurality of check nodes and at least one of the plurality of variable nodes, that are saturated to a maximum fixed-precision magnitude.

3. The decoder recited in claim 1, wherein the degree of saturation is based at least in part on a number of saturated nodes in the LDPC decoding system.

4. The decoder recited in claim 1, wherein:
the degree of saturation is based at least in part on a number of saturated nodes in the LDPC decoding system; and
a node is declared saturated if an associated minimum attenuated message after attenuation reaches a maximum fixed-precision magnitude.

5. The decoder recited in claim 1, wherein outputting the more aggressively attenuated message to the plurality of check nodes includes:
outputting a first more aggressively attenuated message that is based at least in part on a first-most minimum variable node message; and
outputting a second more aggressively attenuated message that is based at least in part on a second-most minimum variable node message.

6. The decoder recited in claim 1, wherein outputting the more aggressively attenuated message to the plurality of check nodes includes:
outputting a first more aggressively attenuated message ($L_{min1}^{(j)}$) that is based at least in part on a first-most minimum variable node message ($l_{min1}^{(j)}$), including by using $L_{min1}^{(j)} = \lfloor \alpha_{ds} \cdot l_{min1}^{(j)} + \beta_{ds} \rfloor$, wherein $\alpha_{ds}$ is associated with an attenuation factor and $\beta_{ds}$ is associated with an attenuation rounding; and
outputting a second more aggressively attenuated message ($L_{min2}^{(j)}$) that is based at least in part on a second-most minimum variable node message ($l_{min2}^{(j)}$) including by using $L_{min2}^{(j)} = \lfloor \alpha_{ds} \cdot l_{min2}^{(j)} + \beta_{ds} \rfloor$.

7. The decoder recited in claim 1, wherein:
a first attenuation factor ($\alpha$) is used to generate the less aggressively attenuated message and a second attenuation factor ($\alpha_{ds}$) is used to generate the more aggressively attenuated message, wherein $\alpha_{ds} < \alpha$; and
a first attenuation rounding ($\beta$) is used to generate the less aggressively attenuated message and a second attenuation rounding ($\beta_{ds}$) is used to generate the more aggressively attenuated message, wherein $\lfloor \alpha_{ds} + \beta_{ds} \rfloor \leq \lfloor \alpha + \beta \rfloor$.

8. The decoder recited in claim 1, wherein:
a first attenuation factor ($\alpha$) is used to generate the less aggressively attenuated message and a second attenuation factor ($\alpha_{ds}$) is used to generate the more aggressively attenuated message, wherein $\alpha_{ds} < \alpha$;
a first attenuation rounding ($\beta$) is used to generate the less aggressively attenuated message and a second attenuation rounding ($\beta_{ds}$) is used to generate the more aggressively attenuated message, wherein $\lfloor \alpha_{ds} + \beta_{ds} \rfloor \leq \lfloor \alpha + \beta \rfloor$; and at least one of $\alpha$, $\alpha_{ds}$, $\beta$, or $\beta_{ds}$ is determined using density evolution.

9. A method, comprising:
generating a global de-saturation control signal that is determined based at least in part on a saturation threshold and a degree of saturation in a low-density parity-check (LDPC) decoding system that uses a fixed-point number representation;
in the event the global de-saturation control signal is a first value, outputting a more aggressively attenuated message to a plurality of check nodes compared to when the global de-saturation control signal is a second value; and
in the event the global de-saturation control signal is the second value, outputting a less aggressively attenuated message to the plurality of check nodes compared to when the global de-saturation control signal is the first value.

10. The method recited in claim 9, wherein the degree of saturation is based at least in part on a number of messages, passed between at least one of the plurality of check nodes and at least one of the plurality of variable nodes, that are saturated to a maximum fixed-precision magnitude.

11. The method recited in claim 9, wherein the degree of saturation is based at least in part on a number of saturated nodes in the LDPC decoding system.

12. The method recited in claim 9, wherein:
the degree of saturation is based at least in part on a number of saturated nodes in the LDPC decoding system; and
a node is declared saturated if an associated minimum attenuated message after attenuation reaches a maximum fixed-precision magnitude.

13. The method recited in claim 9, wherein outputting the more aggressively attenuated message to the plurality of check nodes includes:
outputting a first more aggressively attenuated message that is based at least in part on a first-most minimum variable node message; and
outputting a second more aggressively attenuated message that is based at least in part on a second-most minimum variable node message.

14. The method recited in claim 9, wherein outputting the more aggressively attenuated message to the plurality of check nodes includes:
outputting a first more aggressively attenuated message ($L_{min1}^{(j)}$) that is based at least in part on a first-most minimum variable node message ($l_{min1}^{(j)}$), including by using $L_{min1}^{(j)} = \lfloor \alpha_{ds} \cdot l_{min1}^{(j)} + \beta_{ds} \rfloor$, wherein $\alpha_{ds}$ is associated with an attenuation factor and $\beta_{ds}$ is associated with an attenuation rounding; and
outputting a second more aggressively attenuated message ($L_{min2}^{(j)}$) that is based at least in part on a second-most minimum variable node message ($l_{min2}^{(j)}$) including by using $L_{min2}^{(j)} = \lfloor \alpha_{ds} \cdot l_{min2}^{(j)} + \beta_{ds} \rfloor$.

15. The method recited in claim 9, wherein:
a first attenuation factor ($\alpha$) is used to generate the less aggressively attenuated message and a second attenuation factor ($\alpha_{ds}$) is used to generate the more aggressively attenuated message, wherein $\alpha_{ds} < \alpha$; and
a first attenuation rounding ($\beta$) is used to generate the less aggressively attenuated message and a second attenuation rounding ($\beta_{ds}$) is used to generate the more aggressively attenuated message, wherein $\lfloor \alpha_{ds} + \beta_{ds} \rfloor \leq \lfloor \alpha + \beta \rfloor$.

16. The method recited in claim 9, wherein:
- a first attenuation factor ($\alpha$) is used to generate the less aggressively attenuated message and a second attenuation factor ($\alpha_{ds}$) is used to generate the more aggressively attenuated message, wherein $\alpha_{ds} < \alpha$;
- a first attenuation rounding ($\beta$) is used to generate the less aggressively attenuated message and a second attenuation rounding ($\beta_{ds}$) is used to generate the more aggressively attenuated message, wherein $\lfloor \alpha_{ds} + \beta_{ds} \rfloor \leq \lfloor \alpha + \beta \rfloor$; and
- at least one of $\alpha$, $\alpha_{ds}$, $\beta$, or $\beta_{ds}$ is determined using density evolution.

17. A computer program product embodied in a non-transitory computer readable medium and comprising computer instructions for:
- generating a global de-saturation control signal that is determined based at least in part on a saturation threshold and a degree of saturation in a low-density parity-check (LDPC) decoding system that uses a fixed-point number representation;
- in the event the global de-saturation control signal is a first value, outputting a more aggressively attenuated message to a plurality of check nodes compared to when the global de-saturation control signal is a second value; and
- in the event the global de-saturation control signal is the second value, outputting a less aggressively attenuated message to the plurality of check nodes compared to when the global de-saturation control signal is the first value.

18. The computer program product recited in claim 17, wherein the degree of saturation is based at least in part on a number of messages, passed between at least one of the plurality of check nodes and at least one of the plurality of variable nodes, that are saturated to a maximum fixed-precision magnitude.

19. The computer program product recited in claim 17, wherein outputting the more aggressively attenuated message to the plurality of check nodes includes:
- outputting a first more aggressively attenuated message that is based at least in part on a first-most minimum variable node message; and
- outputting a second more aggressively attenuated message that is based at least in part on a second-most minimum variable node message.

20. The computer program product recited in claim 17, wherein outputting the more aggressively attenuated message to the plurality of check nodes includes:
- outputting a first more aggressively attenuated message ($L_{min1}^{(j)}$) that is based at least in part on a first-most minimum variable node message ($l_{min1}^{(j)}$), including by using $L_{min1}^{(j)} = \lfloor \alpha_{ds} \cdot l_{min1}^{(j)} + \beta_{ds} \rfloor$, wherein is associated with an attenuation factor and $\beta_{ds}$ is associated with an attenuation rounding; and
- outputting a second more aggressively attenuated message ($L_{min2}^{(j)}$) that is based at least in part on a second-most minimum variable node message ($l_{min2}^{(j)}$), including by using $L_{min2}^{(j)} = \lfloor \alpha_{ds} \cdot l_{min2}^{(j)} + \beta_{ds} \rfloor$.

* * * * *

UNITED STATES PATENT AND TRADEMARK OFFICE
CERTIFICATE OF CORRECTION

PATENT NO. : 11,251,810 B2
APPLICATION NO. : 16/988429
DATED : February 15, 2022
INVENTOR(S) : Yingquan Wu It is certified that error appears in the above-identified patent and that said Letters Patent is hereby corrected as shown below:

On the Title Page

Item (54), delete "LOW-DENSITY PARITY-CHECK DECODING WITH DESATURATION" and insert --LOW-DENSITY PARITY-CHECK DECODING WITH DE-SATURATION--, therefor.

In the Specification

In Column 1, Line(s) 1 & 2, delete "LOW-DENSITY PARITY-CHECK DECODING WITH DESATURATION" and insert --LOW-DENSITY PARITY-CHECK DECODING WITH DE-SATURATION--, therefor.

In Column 2, Line 57, before "messages", insert --$l_{min\,1}$--.

In Column 3, Line 23, delete "$l_{min1}^{(j)} = \lfloor \alpha_{ds} \cdot l_{min1}^{(j)} + \beta_{ds} \rfloor$ and $L_{min2}^{(j)} = \lfloor \alpha_{ds} \cdot l_{min2}^{(j)} + \beta_{ds} \rfloor$)." and insert --$L_{min\,1}^{(j)} = \left| \alpha_{ds} \cdot l_{min\,1}^{(j)} + \beta_{ds} \right|$ and $L_{min\,2}^{(j)} = \left| \alpha_{ds} \cdot l_{min\,2}^{(j)} + \beta_{ds} \right|$).--, therefor.

In Column 4, Line 1, delete "(e.g., $L_{i \to j}$ (206*a*))" and insert --(e.g., $L_{j \to i}$ (206a))--, therefor.

In Column 4, Line 40, delete "(e.g., (206*b*))" and insert --(e.g., $L_{j \to i}$ (206b))--, therefor.

In Column 7, Line 47, after "where", insert --$L_{j \to i}$--.

In Column 9, pseudocode 2, sequence no 5, delete "{$S^{(j)}_i$, $i_{min1}^{(j)}{}_i$, $L_{min1}^{(j)}{}_i$, $L_{min2}^{(j)}{}_i$} where $j_i$ is the preceding layer of VN i" and insert --$\{S^{(j_i)}, i_{min\,1}^{(j_i)}, L_{min\,1}^{(j_i)}, L_{min\,2}^{(j_i)}\}$, where $j_i$ is the preceding layer of VN *i*--, therefor.

Signed and Sealed this
Eighteenth Day of October, 2022

*Katherine Kelly Vidal*
Katherine Kelly Vidal
*Director of the United States Patent and Trademark Office*

In Column 9, pseudocode 2, sequence no 6, delete

"Compute $L_{j_i \to i}^{new} \leftarrow \begin{cases} S^{(j_i)} \cdot S_{i \to j_i} \cdot L_{min1}^{(j_i)}, & \text{if } i \neq i_{min1}^{(j_i)} \\ S^{(j_i)} \cdot S_{i \to j_i} \cdot L_{min2}^{(j_i)}, & \text{if } i = i_{min1}^{(j_i)} \end{cases}$" and insert --Compute $L_{j_i \to i}^{new} \leftarrow \begin{cases} S^{(j_i)} \cdot S_{i \to j_i} \cdot L_{min\,1}^{(j_i)}, & \text{if } i \neq i_{min\,1}^{(j_i)} \\ S^{(j_i)} \cdot S_{i \to j_i} \cdot L_{min\,2}^{(j_i)}, & \text{if } i = i_{min\,1}^{(j_i)} \end{cases}$--, therefor.

In Column 11, pseudocode 3, sequence no 9, delete "Compute $L_{j \to i} \leftarrow P_i - L_{j \to i}$" and insert --Compute $L_{i \to j} \leftarrow P_i - L_{j \to i}$--, therefor.

In the Claims

In Column 16, Line 10, Claim 15, delete "$\lfloor\alpha_{ds} + \beta_{ds}\rfloor \leq \alpha+\beta\rfloor$." and insert --$\lfloor\alpha_{ds} + \beta_{ds}\rfloor \leq \lfloor\alpha + \beta\rfloor$--, therefor.

In Column 18, Line 21, Claim 20, delete "$(L_{min2}^{(j)})$" and insert --$(L_{min1}^{(j)})$--, therefor.